United States Patent
Kutz et al.

(10) Patent No.: US 7,734,989 B2
(45) Date of Patent: Jun. 8, 2010

(54) MULTI-STANDARD TURBO INTERLEAVER USING TABLES

(75) Inventors: Gideon Kutz, Ramat Hasharon (IL); Amir I. Chass, Ramat Hasharon (IL)

(73) Assignee: Freescale Semiconductor, Inc., Austin, TX (US)

( * ) Notice: Subject to any disclaimer, the term of this patent is extended or adjusted under 35 U.S.C. 154(b) by 775 days.

(21) Appl. No.: 10/596,369

(22) PCT Filed: Dec. 8, 2004

(86) PCT No.: PCT/IB2004/004319

§ 371 (c)(1),
(2), (4) Date: Jul. 13, 2006

(87) PCT Pub. No.: WO2005/060106

PCT Pub. Date: Jun. 30, 2005

(65) Prior Publication Data

US 2007/0101231 A1    May 3, 2007

(30) Foreign Application Priority Data

Dec. 11, 2003  (GB)  ................................. 0328783.6

(51) Int. Cl.
H03M 13/00  (2006.01)
(52) U.S. Cl. ...................................... 714/780; 370/340
(58) Field of Classification Search ................. 714/780; 370/342
See application file for complete search history.

(56) References Cited

U.S. PATENT DOCUMENTS 6,851,039 B2 * 2/2005 Bickerstaff ................. 711/219
7,155,642 B2 * 12/2006 Han ........................... 714/701
7,269,149 B2 * 9/2007 Kukla et al. ................. 370/328
7,343,530 B2 * 3/2008 Shin ........................... 714/702
2002/0091900 A1  7/2002 Han
2002/0119803 A1  8/2002 Bitterlich et al.
2002/0159323 A1  10/2002 Makabe et al.
2002/0159423 A1  10/2002 Yao et al.
2004/0255217 A1 * 12/2004 Garrett et al. ............... 714/746

FOREIGN PATENT DOCUMENTS

EP    1195910 A2    9/2000

OTHER PUBLICATIONS

Shin et al; "Processor-Based Turbo Interleaver for Multiple Third-Generation Wireless Standards"; IEEE, vol. 7, No. 5, May 2003.

(Continued)

*Primary Examiner*—Sam Rizk

(57) ABSTRACT

An interleaver for a turbo encoder and decoder comprising a first table populated with a first set of parameters to allow intra-row permutation of data within an array in accordance with a first wireless communication standard when operation in the first wireless communication standard is required and a second table populated with a second set of parameters to allow inter-row permutation of the data in accordance with the first wireless communication standard when operation in the first wireless communication standard is required wherein the first table is populated with a third set of parameters to allow intra-row permutation of data within an array in accordance with a second wireless communication standard when operation in the second wireless communication standard is required and to populate the second table with a fourth set of parameters to allow inter-row permutation of the data in accordance with the second wireless communication standard when operation in the second wireless communication standard is required.

14 Claims, 2 Drawing Sheets

OTHER PUBLICATIONS

3rd Generation Partnership Project (3GPP); Technical Specification; "Group Radio Access Network Multiplexing and Channel Coding" Jun. 2002, pp. 17-20.

Ampadu et al; "An Efficient Hardware Interleaver for 3G Turbo Decoding"; Proc. of Radio And Wireless Conference, USA, Aug. 2003, pp. 199-201.

* cited by examiner

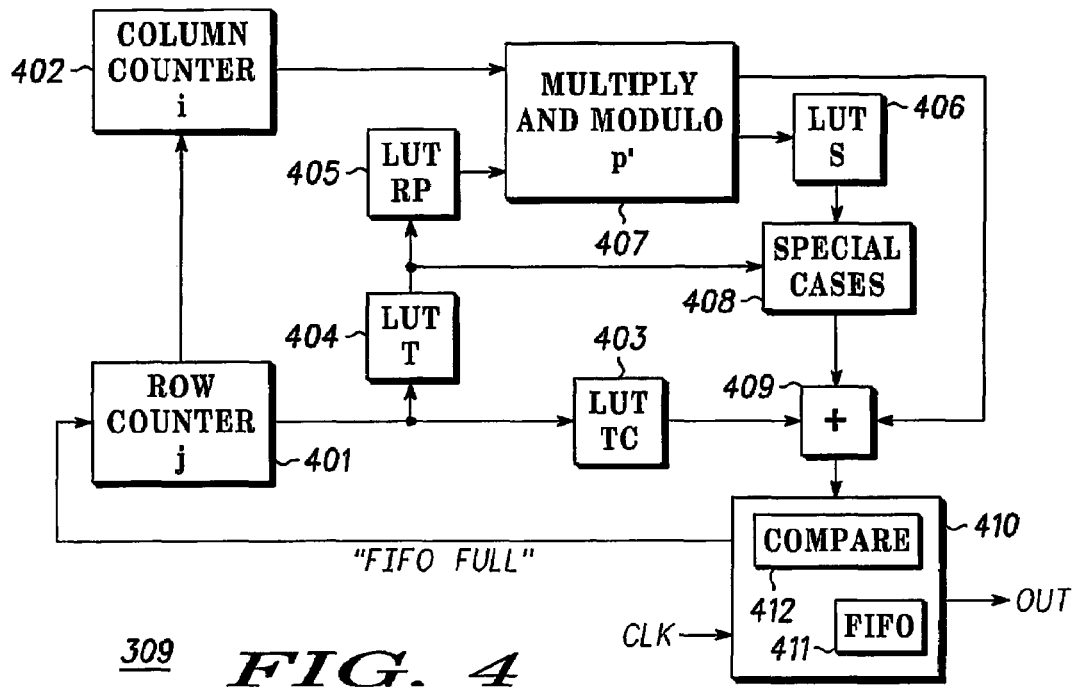
_309_ FIG. 4
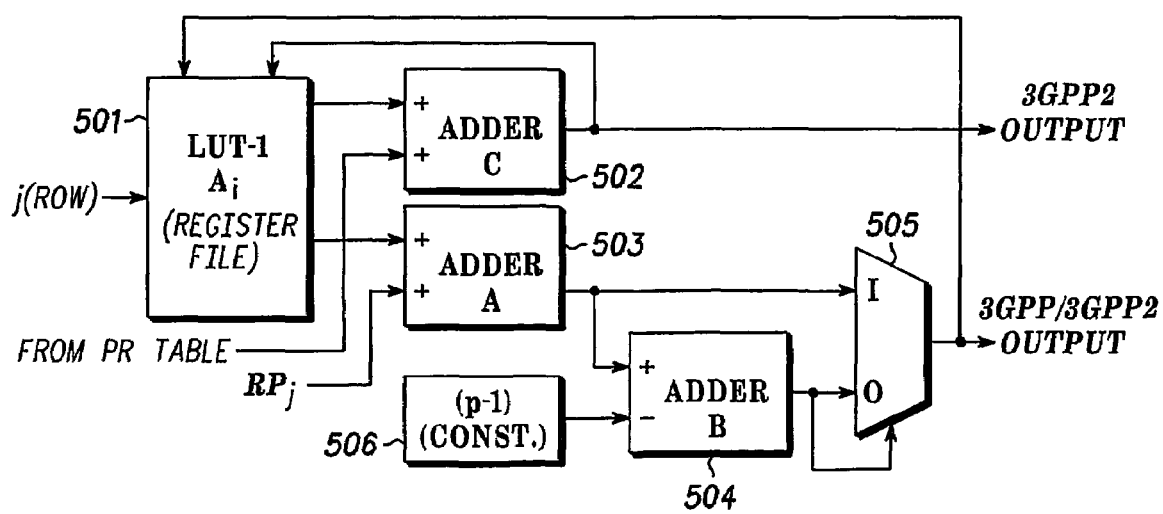
_407_ FIG. 5

US 7,734,989 B2

MULTI-STANDARD TURBO INTERLEAVER USING TABLES

PRIORITY

This application claims priority to an application entitled "Interleaver for a turbo encoder and decoder" filed at the UK Patent Office on Dec. 11, 2003 and assigned Serial No. GB0328783.6.

BACKGROUND OF THE INVENTION

1. Field of the Invention

The present invention relates to an interleaver for a turbo encoder and decoder.

2. Description of the Related Art

Wireless communication systems are widely deployed to provide various types of communications such as voice and data. One such system is wide band code division multiple access WCDMA, which has been adopted in various competing wireless communication standards, for example $3^{rd}$ generation partnership project 3GPP and 3GPP2.

To overcome data corruption that can occur during RF transmission the different wireless communication standards typically include some form of channel coding, where one common channel coding technique is turbo coding.

Turbo coding involves the use of a turbo encoder for encoding a code segment (i.e. a data packet) and a turbo decoder for the decoding of the encoded code segment.

As shown in FIG. 1, a turbo encoder 100 includes two convolutional encoders 101, 102 and an interleaver 103, where the interleaver 103 shuffles (i.e. interleaves) the information bits in the packet in accordance with a specified interleaving scheme.

The turbo encoder 100 uses a first convolutional encoder 101 to encode information bits (i.e. systematic bits) within a code block to generate a first sequence of parity bits (i.e. parity 1 bits) in parallel to the interleaver 103 shuffling the information bits, where the shuffled information bits are encoded by a second encoder 102 to generate a second sequence of parity bits (i.e. parity 2 bits). The information bits and the parity bits in the first and second sequence are then modulated and transmitted to a receiver.

The information bits and the first and second sequence of parity bits are received by a receiver and decoded by a turbo decoder.

With reference to FIG. 2, the turbo decoder 200 initially stores the received information bits and the parity bits in the first and second sequence in a buffer (not shown). Initially, the information bits and the first sequence of parity bits from the first convolutional encoder are retrieved from the buffer and decoded by a first decoder 201 (i.e. a first soft in soft out SISO decoder) to provide 'extrinsic' information (i.e. a-posteriori data) indicative of adjustments in the confidence in the detected values for the information bits. In one embodiment, intermediate results (i.e. a-priori) that include the extrinsic information from the first decoder 201 are then stored in the buffer in an interleaved order matching the code interleaving used at the transmitter. Alternatively, embodiment the extrinsic information from the first decoder (i.e. first SISO decoder) can be stored in the buffer in a non-interleaved order and read from the buffer in an interleaved order.

The intermediate results, the information and the second sequence of parity bits from the second encoder are retrieved from the buffer and decoded by a second decoder 202 (i.e. a second SISO decoder) to provide extrinsic information indicative of further adjustments in the confidence in the detected values for the information bits. Intermediate results that comprise the extrinsic information from the second decoder 202 (i.e. a second SISO decoder) are then stored in the buffer in a deinterleaved order complementary to the code interleaving performed at the transmitter. Alternatively, the extrinsic information can be stored in an interleaved order and read from the buffer in a deinterleaved order. The intermediate results are used in a next decoding iteration performed by the turbo decoder 200. The turbo decoder 200 performs a predetermined number of decoding iterations before producing a decision on the value of the decoded information bit.

Accordingly, the interleaving and deinterleaving of data is an important aspect of turbo encoding and decoding.

However, the interleaving and deinterleaving specifications that form part of the turbo coding/decoding process can be different for the different wireless communication standards. As such, dual standard wireless communication devices, for example a 3GPP and 3GPP2 compliant radiotelephone, typically require multiple interleavers and deinterleavers to accommodate the different standards, which can result in increased die size, power consumption and cost.

It is desirable to improve this situation.

SUMMARY OF THE INVENTION

In accordance with a first aspect of the present invention there is provided an interleaver for a turbo encoder or decoder according to claim 1.

This provides the advantage of allowing a single interleaver to support more than one wireless communication standard.

In accordance with a second aspect of the present invention there is provided a method for interleaving for a turbo encoder and decoder.

BRIEF DESCRIPTION OF THE DRAWINGS

An embodiment of the invention will now be described, by way of example, with reference to the drawings, of which:

FIG. 4 illustrates an address generation unit according to an embodiment of the present invention;

FIG. 5 illustrates a feature of an address generation unit according to an embodiment of the present invention;

DETAILED DESCRIPTION OF THE PREFERRED EMBODIMENTS

Figure 1:
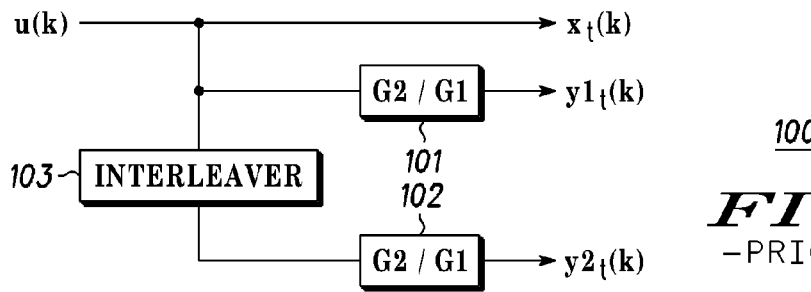
FIG. 1 illustrates a known turbo encoder.
Figure 2:
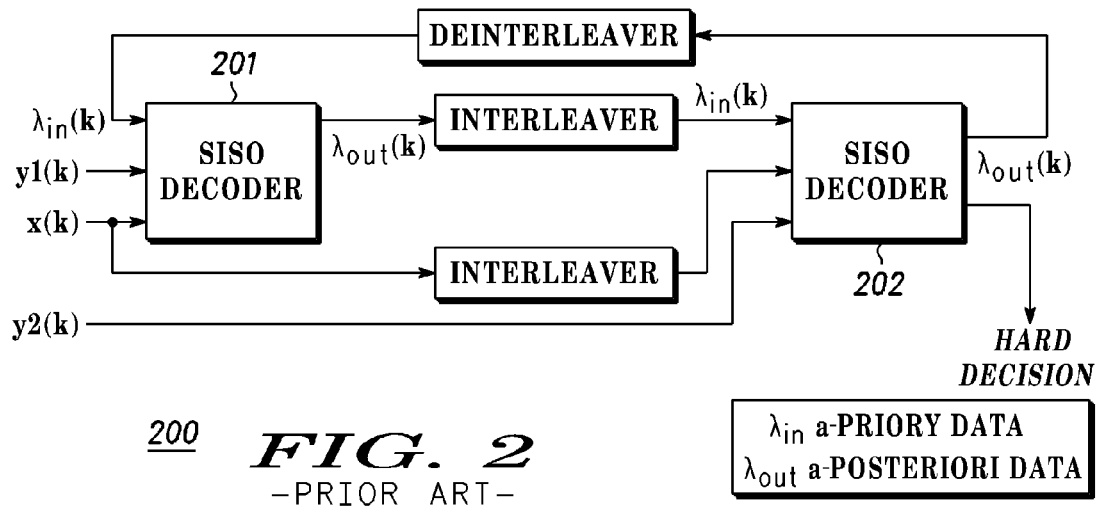
FIG. 2 illustrates a known turbo decoder.
Figure 3:
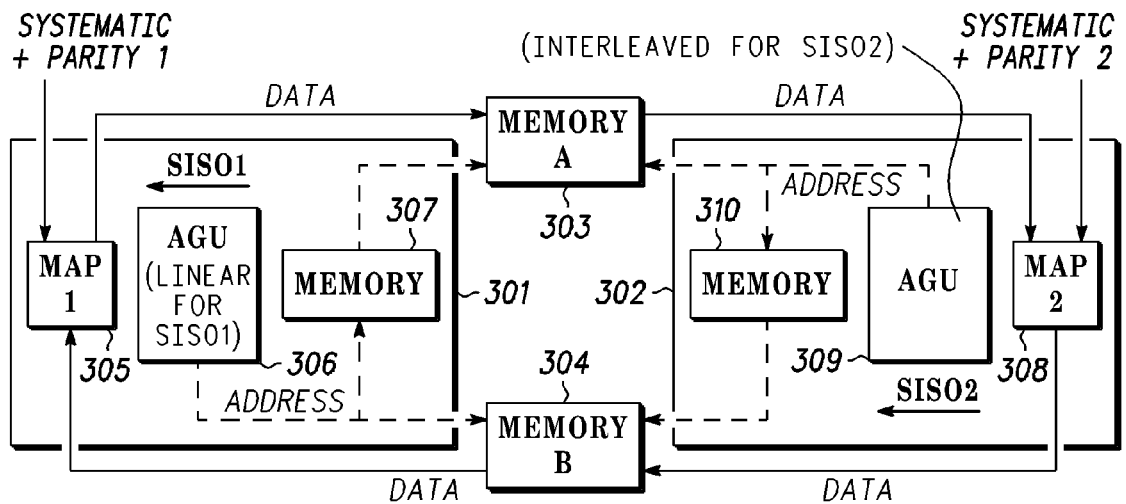
FIG. 3 illustrates a turbo decoder according to an embodiment of the present invention.

FIG. 3 shows a turbo decoder 300. The turbo decoder 300 includes a first SISO decoder 301, a second SISO decoder 302, a first memory module 303 and a second memory module 304.

The first SISO decoder 301 has a first maximum a posterior MAP decoding module 305 for executing a MAP algorithm, a first address generation unit AGU 306 and a first buffer 307.

The first MAP decoding module 305 is arranged to receive information bits and parity 1 bits from a transmitting unit (not shown) with the first AGU 306 producing linear address sequences to allow the first MAP decoding module 305 to read intermediate results (i.e. a priori data) from the second memory module 304 and write extrinsic information (i.e. a-posterior data) generated by the first MAP decoding module 305 to the first memory module 303.

The second SISO decoder 302 has a second maximum a posterior MAP decoding module 308 for executing the MAP algorithm, a second address generation unit AGU 309 and a second buffer 310.

The second MAP decoding module 308 is arranged to receive information bits and parity 2 bits from a transmitting unit (not shown) with the second AGU 309 producing interleaving/de-interleaving address sequences to allow the second MAP decoding module 308 to read extrinsic information (i.e. a-posterior data) from the first memory module 303 in an interleaved order and write to the second memory module 304 intermediate results (i.e. a priori data) generated by the second MAP decoding module 308 in an de-interleaved order (i.e. in the same order as the data stored in the first memory module 303).

The first buffer 307 and second buffer 310 are arranged to temporarily store the addresses produced by the first AGU 306 and second AGU 309 respectively, thereby allowing the same address locations to be used in the first memory module 303 and second module 304 when reading and writing associated data during the same turbo decoding iteration. For example, if, during the same turbo decoding iteration, a-priori data was read from address x in the second memory module 304 then the related a-posteriori data will be written to location x in the first memory module 303.

Although the above embodiment of a turbo decoder uses two separate SISO decoders other structures are possible. For example, as the first SISO decoder and second SISO decoder processes do not occur simultaneous a single SISO decoder could be used that is arranged to perform the first SISO decoder and second SISO decoder functions sequentially. Additionally, or alternatively, the first memory module and second memory module could be combined into a single memory module.

Both the 3GPP WCDMA standard and the 3GPP2 WCDMA standard define different interleaving schemes. Even though both interleaving schemes can be categorised as having the following three stages; first, writing the information bits into a code segment row by row to a two dimensional array (i.e. R×C array); second, interchanging the rows (i.e. inter-row permutation); and three, rearranging the bits/elements within each row (i.e. intra-row permutation), where the bits are then read from the R×C array column by column starting with the upper left most bit/element in the R×C array; the implementation details for the 3GPP and 3GPP2 interleaving schemes are different.

For the 3GPP WCDMA standard the first stage of the interleaving scheme process is defined as follows:

The number of rows R in the array is determined based on the size of the code segment K, where:
  R=5, if $40 \leq K \leq 159$;
  R=10, if $160 \leq K \leq 200$ or $481 \leq K \leq 530$;
  R=20, for all other K.

The number of columns C in the array is determined based upon R and K, as follows:
  C=53, if $481 \leq K \leq 530$; otherwise
  select a prime number p such that $(p+1)*R \geq K$, and then
  select C=min(p−1, p, p+1) such that $R*C \geq K$.

Once R and C are have been determined for a given code segment K, the bits in the code segment are written row by row into the R×C array, starting from row 0, column 0. If there are empty cells at the bottom of the array after the code segment has been written into the array the empty cells are padded with dummy bits.

For the second stage, the inter row permutation process involves permutating the rows R according to a inter row permutation sequence T(i), where i represents the row number, which is selected from among four possible sequences $T_A$, $T_B$, $T_C$ and $T_D$, defined by the 3GPP WCDMA standard as:

$T_A$=(19,9,14,4,0,2,5,7,12,18,10,8,13,17,3,1,16,6,15,11);

$T_B$=(19,9,14,4,0,2,5,7,12,18,16,13,17,15,3,1,6,11,8,10);

$T_C$=(9,8,7,6,5,4,3,2,1,0) and $T_D$=(4,3,2,1,0)

where
$T_D$ is selected if R=5;
$T_C$ is selected if R=10;
$T_B$ is selected if $(2281 \leq K \leq 2480)$ or $(3161 \leq K \leq 3210)$
otherwise $T_A$ is selected.

For the third stage, the intra row permutation process involves permutating the column elements of the array as follows:

First a base sequence s of length p is generated where the base sequence is derived using $s(j)=[v.s(j-1)] \mod p$ for $j=1,2,\ldots(p-1)$ (for $j=0$ s(0) equals 1)

where j represents the column numbers and v is a primitive root where each prime number p derived above has an associated primitive root v, as defined in the 3GPP standard and as shown in table 1 below.

TABLE 1

| p | v |
|---|---|
| 7 | 3 |
| 11 | 2 |
| 13 | 2 |
| 17 | 3 |
| 19 | 2 |
| 23 | 5 |
| 29 | 2 |
| 31 | 3 |
| 37 | 2 |
| 41 | 6 |
| 43 | 3 |
| 47 | 5 |
| 53 | 2 |
| 59 | 2 |
| 61 | 2 |
| 67 | 2 |
| 71 | 7 |
| 73 | 5 |
| 79 | 3 |
| 83 | 2 |
| 89 | 3 |
| 97 | 5 |
| 101 | 2 |
| 103 | 5 |
| 107 | 2 |
| 109 | 6 |
| 113 | 3 |
| 127 | 3 |
| 131 | 2 |
| 137 | 3 |
| 139 | 2 |
| 149 | 2 |
| 151 | 6 |
| 157 | 5 |
| 163 | 2 |
| 167 | 5 |
| 173 | 2 |
| 179 | 2 |
| 181 | 2 |
| 191 | 19 |
| 193 | 5 |

TABLE 1-continued

| p | v |
|---|---|
| 197 | 2 |
| 199 | 3 |
| 211 | 2 |
| 223 | 3 |
| 227 | 2 |
| 229 | 6 |
| 233 | 3 |
| 239 | 7 |
| 241 | 7 |
| 251 | 6 |
| 257 | 3 |

Having determined the base sequence a sequence of prime numbers $q_j$ is constructed. The prime number sequence $q_j$ has R elements and is essentially a sequence of prime numbers that are not factors of (p−1).

The prime number sequence $q_j$ is associated with rows 0 to R−1 respectively where the prime number sequence $q_j$ elements are permuted in accordance with the appropriate inter-row permutation sequence. Accordingly, the elements of the permutated prime number sequence are determined by:

$$r_i = q_{jT(i)}$$

Having determined the base sequence and permutated prime number sequence $r_i$ the intra-row permutation sequence is determined, where for C=p−1 the original bit position of the jth permutated bit of the ith row is determined from $U_i(j)$ where:

$$U_i(j) = s((j \times r_i) \bmod (p-1)) - 1, j = 0, 1, \ldots, (p-2),$$

However, as stated above C can be equal to p−1, p and p+1. Thus in the cases of C=p and p+1 $U_i(j)$ needs to be extended with special cases and the '−1' is removed from the equation. In the case of C=p then $U_i(p-1)=0$ and for the case of C=p+1 then $U_i(p-1)=0$ and $U_i(p)=p$. Additionally, for K=R*C and C=p+1 the values $U_{R-1}(p)$ and $U_{R-1}(0)$ are exchanged.

The interleaved bits are read out column by column from the R×C array from top to bottom starting from column 0, row 0.

For the 3GPP2 WCDMA standard the first stage of the interleaving scheme process is defined as follows The number of rows R in the array is set at R=32 for a code segment K of any size.

The number of columns C in the array is determined by:

C=$2^n$, where n is the smallest integer such that
$2^{n+5} \geq K$ and

C=p

Once R and C have been determined for a given code segment K, the bits in the code segment are written row by row into the R×C array, starting from row 0, column 1. If there are empty cells at the bottom of the array after the code segment has been written into the array the empty cells are padded with dummy bits.

For the second stage, the inter row permutation process involves permutating the rows R according to the following pattern where the inter-row permutations are performed using a bit reversal rule:

T={0,16,8,24,4,20,12,28,2,18,10,26,6,22,14,30,1,17,
9,25,5,21,13,29,3,19,11,27,7,23,15,31}

For the third stage, the intra row permutation process the permutated prime number sequence is determined from table 2 below:

TABLE 2

| Row | n = 4 | n = 5 | n = 6 | n = 7 | n = 8 | n = 9 | n = 10 |
|---|---|---|---|---|---|---|---|
| 0 | 5 | 27 | 3 | 15 | 3 | 13 | 1 |
| 1 | 15 | 3 | 27 | 127 | 1 | 335 | 349 |
| 2 | 5 | 1 | 15 | 89 | 5 | 87 | 303 |
| 3 | 15 | 15 | 13 | 1 | 83 | 15 | 721 |
| 4 | 1 | 13 | 29 | 31 | 19 | 15 | 973 |
| 5 | 9 | 17 | 5 | 15 | 179 | 1 | 703 |
| 6 | 9 | 23 | 1 | 61 | 19 | 333 | 761 |
| 7 | 15 | 13 | 31 | 47 | 99 | 11 | 327 |
| 8 | 13 | 9 | 3 | 127 | 23 | 13 | 453 |
| 9 | 15 | 3 | 9 | 17 | 1 | 1 | 95 |
| 10 | 7 | 15 | 15 | 119 | 3 | 121 | 241 |
| 11 | 11 | 3 | 31 | 15 | 13 | 155 | 187 |
| 12 | 15 | 13 | 17 | 57 | 13 | 1 | 497 |
| 13 | 3 | 1 | 5 | 123 | 3 | 175 | 909 |
| 14 | 15 | 13 | 39 | 95 | 17 | 421 | 769 |
| 15 | 5 | 29 | 1 | 5 | 1 | 5 | 349 |
| 16 | 13 | 21 | 19 | 85 | 63 | 509 | 71 |
| 17 | 15 | 19 | 27 | 17 | 131 | 215 | 557 |
| 18 | 9 | 1 | 15 | 55 | 17 | 47 | 197 |
| 19 | 3 | 3 | 13 | 57 | 131 | 425 | 499 |
| 20 | 1 | 29 | 45 | 15 | 211 | 295 | 409 |
| 21 | 3 | 17 | 5 | 41 | 173 | 229 | 259 |
| 22 | 15 | 25 | 33 | 93 | 231 | 427 | 335 |
| 23 | 1 | 29 | 15 | 87 | 171 | 83 | 253 |
| 24 | 13 | 9 | 13 | 63 | 23 | 409 | 677 |
| 25 | 1 | 13 | 9 | 15 | 147 | 387 | 717 |
| 26 | 9 | 23 | 15 | 13 | 243 | 193 | 313 |
| 27 | 15 | 13 | 31 | 15 | 213 | 57 | 575 |
| 28 | 11 | 13 | 17 | 81 | 189 | 501 | 189 |
| 29 | 3 | 1 | 5 | 57 | 51 | 313 | 15 |
| 30 | 15 | 13 | 15 | 31 | 15 | 489 | 75 |
| 31 | 5 | 13 | 33 | 69 | 67 | 391 | 163 |

The 3GPP2 intra-row permutation is described as $x(i+1) = (x(i)+c) \bmod 2^n$, and $x(0)=c$ is the row specific value from the table. This can also be expressed as $x(i+1) = (i \ast Rj) \bmod p'$, where p' is equal to $2^n$ for 3GPP2 (and p−1 for 3GPP). Rj is the value of c for the row j and x(i) is the inter row permutation pattern.

FIG. 4 illustrates the AGU 309, which, as stated above, is arranged to determine the interleaved addresses for both the 3GPP and 3GPP2 WCDMA standards.

The AGU 309 includes a row counter 401, a column counter 402, a first look-up table LUT 403, a second LUT 404, a third LUT 405, a fourth LUT 406, a multiply and modulo module 407, a special cases module 408, a combiner 409 and a compare module 410.

An output from the row counter 401 is coupled to the column counter 402, the first LUT 403 and the second LUT 404.

The first LUT 403 is arranged to store inter-row permutation data, as detailed below, with an output form the first LUT 403 being coupled to the combiner 409, which forms an inter-row permutation path.

The second LUT 404 is arranged to store inter-row permutation data, as detailed below, with an output from the second LUT 404 being coupled to the third LUT 405 and the special cases module 408.

The third LUT 405 is arranged to store permutated prime number sequences, as described below, with an output from the third LUT 405 being coupled to the multiply and modulo module 407.

An output from the column counter 402 is coupled to the multiply and modulo module 407.

The multiply and modulo module 407 has one output coupled directly to the combiner 409 and a second output coupled to the fourth LUT 406.

The fourth LUT 406 is arranged to store 's' the base sequence for intra-row permutations, as described below, with an output from the fourth LUT 406 being coupled to the special cases module 408.

An output from the special cases module 408, which forms an intra row permutation path, is coupled to the combiner 409 with an output from the combiner 409 being coupled to the compare module 410.

Using the inter-row permutation path and the intra-row permutation path data the compare module 410 generates interleaved addresses, as detail below, in addition to providing a clock signal for driving the row counter 401. The compare module 410 is run from a clock input signal.

A controller (not shown) (for example a DSP) is arranged to configure the AGU 309 to generate interleaved addresses in accordance with either the 3GPP or 3GPP2 WCDMA standard by initialising the relevant interleaving parameters (e.g. R, C, p) and the four LUT's in accordance with the relevant interleaving scheme criteria.

For example, if the AGU 309 is to operate according to the 3GPP WCDMA standard the controller determines the parameter values for R, C and p in accordance with the 3GPP standard and stores these values, for example in a register (not shown). Additionally, the first LUT 403, the second LUT 404, the third LUT 405 and the fourth LUT 406 are loaded with relevant permutation pattern data according to the 3GPP WCDMA standard, as described below.

If the AGU 309 is to operate according to the 3GPP2 WCDMA standard the controller determines the parameter values for R, C and p in accordance with the 3GPP2 standard and stores these values. Additionally, the first LUT 403, the second LUT 404, the third LUT 405 and the fourth LUT 406 are loaded with relevant permutation pattern data according to the 3GPP2 WCDMA standard.

The controller can be arranged to initiate the configuration of the AGU 309 to operate in accordance with either the 3GPP or 3GPP2 standard by any suitable means, for example by user selection or by determination from received signals from a transmitting unit.

The operation of the AGU 309 will now be described.

The row counter 401 and column counter 402 are both initialised to reference the first R×C array element. As the 3GPP standard specifies that the first row and column is zero respectively the controller sets R=C=0. However, as the 3GPP2 standard specifies that the first row equals 0 but the first column equals 1 the controller sets R=0 and C=1. Typically, this operation will be implicit by starting the interleaving from a given column number.

For every interleaver clock cycle the row counter 401 is increased by one, to point to the next row in the array. When the row counter 401 equals R the row counter 401 initiates an increase in the column counter 402, to point to the next column in the array, and resets the row counter 401 to zero.

The first LUT 403 is arranged to map the permuted i row counter values (i.e. i can be regarded as the permuted row value) to the original inter-row numbers (i.e. without permutation). Therefore, the i counter can be regarded as a counter that operates on the interleaved table.

Accordingly, if the AGU 309 is to be configured for operation according to the 3GPP standard the controller initiates the loading of the appropriate 3GPP inter row permutation sequence T(i), if the AGU 309 is to be configured for operation according to the 3GPP2 standard the controller initiates the loading of the 3GPP2 inter row permutation sequence T.

To avoid the use of an additional multiplier within the AGU 309 the inter row permutation data stored in the first LUT 403 is arranged to be multiplied by C prior to loading. The need to multiply the inter row permutation sequence by C arises because the inter row permutation sequence defined by the standard is written row by row, therefore the address will be row*C+column (where C is the number of columns). For example, if C=10, the values 0-9 will be written to the first row, values 10-19 will be entered to the second row etc. The third value in the second row (row and column numbering is from zero therefore second row corresponds to row=1 and the third column corresponds to column=2) can be found from 1*10+2=12.

The mapped inter-row permutation address generated from the first LUT 403 is output to the combiner 409.

The second LUT 404, the third LUT 405 and the multiply and modulo module 407 are arranged to map the permuted column counter values j (i.e. j can be regarded as the permuted column values) to the original intra-row numbers (i.e. without permutation).

The second LUT 404 maps the row counter values to the appropriate inter-row permutated row similar to that performed by the first LUT 403—this is necessary to ensure that the intra-row permutation addresses correspond to the same row that has been inter-row permutated by the inter row permutation path, via the first LUT 403. As with the first LUT 403, if the AGU 309 is to be configured for operation according to the 3GPP standard the controller initiates the loading of the appropriate 3GPP inter row permutation sequence T(i) into the second LUT 404, if the AGU 309 is to be configured for operation according to the 3GPP2 standard the controller initiates the loading of the 3GPP2 inter row permutation sequence T into the second LUT 404, however these values do not need to be multiplied by C.

The third LUT 405 maps the row number, (i.e. the output from the second LUT 404), to the appropriate permutated prime number sequence $r_i$ mod p', where p'=p−1 for the 3GPP standard and p'=C for the 3GPP2 standard. Accordingly, if the AGU 309 is to be configured for operation according to the 3GPP standard the controller initiates the loading of the 3GPP permutated prime number sequence $r_i$ mod p' into the third LUT 405, if the AGU 309 is to be configured for operation according to the 3GPP2 standard the controller initiates the loading of the 3GPP2 permutated prime number sequence $r_i$ mod p into the third LUT 405. The permutated modulo prime number output is provided to the multiply and modulo module 407.

The multiply and modulo module 407 is arrange to multiplied the received permutated modulo prime number values by the column number received from the column counter 402. Additionally, when the multiply and modulo module 407 is configured to operate in accordance with the 3GPP standard the multiply and modulo module calculates the modulo (p−1) of the received permutated modulo prime number and provides this modulo value to a first output of the multiply and modulo module 407. If, however, the multiply and modulo module 407 is configured to operate in accordance with the 3GPP2 standard the multiply and modulo module 407 calculates the modulo (p) of the resulting value and provides this value to the first output of the multiply and modulo module 407, as described below.

The first output of the multiply and modulo module 407 is provided as an input to the fourth LUT 406 that implements the base sequence for intra row permutations.

The fourth LUT 406 stores the series "s" data, as defined in 3GPP, to implement the base sequence intra row permutation. Its function is to be part of the intra-row permutation pattern as described by the equation $$U_i(j)=s((j \times r_i) \bmod(p-1))-1, \text{ where } C=p-1.$$

The 3GPP2 standard does not utilize a base sequence, as such the fourth LUT 406 is populated in such a way that it is transparent, that is s(i)=i, when configured for use in the 3GPP2 standard.

The output from the fourth LUT 406 forms the input to the special cases module 408. The special cases module 408 makes a determination, when the AGU 309 is configured for operation in accordance with the 3GPP standard, as to whether C equals p−1, p or p+1. If C equals p the special cases module 408 sets $U_i(p-1)$ equal to 0, if C equals p+1 the special cases module 408 sets $U_i(p-1)$ equal to 0 and $U_i(p)$ equal to p. Additionally, where K=R*C and C=p+1, then the special cases module 408 is arranged to exchange $U_{R-1}(p)$ and $U_{R-1}(0)$.

The output from the special cases module 408 (i.e. the intra row permutated addresses) is provided to the combiner 409 where the combiner 409 combines the inter row permutation address, via the first LUT 405, and the intra row permutation address, via the second LUT 404 and the third LUT 405, to provide interleaved addresses.

The multiply and modulo module 407 additionally has a second output that is configured to provide intra row permutated addresses in accordance with the 3GPP2 standard second, as described below.

The second output is coupled to the combiner 409, bypassing the fourth LUT 406 and the special cases module 408, where the intra row permutated addresses are combined with the respective inter row permutated addresses, provided by the inter row permutation path, to provide interleaved addresses in accordance with the 3GPP2 standard, thereby providing redundancy for 3GPP2 interleaving.

The interleaved addresses are provided from the combiner 409 to the compare module 410. The compare module 410 compares the received interleaved addresses with the block size (i.e. code segment size). As stated above, if a received code segment does not fully fill the R×C array the end of the array is filled with dummy bits. As such, in some cases, the generated AGU interleaved address will be higher than the block size (i.e. code segment). In these cases, the addresses that are higher than the block size correspond to the dummy bits and should be discarded. To avoid introducing irregularity into the timing of the output of the interleaved address, that can result from the discarding of the 'dummy' bits, the valid addresses are fed into a FIFO 411 within the compare module 410 where the FIFO 411 is arranged to provide valid interleaved addresses at a substantially constant rate when operating in accordance with the 3GPP standard.

For 3GPP2 interleaved addresses the compare module 410 compares the two address provided by the two output paths from the multiply and modulo module 407 and outputs the valid addresses, thereby ensuring for 3GPP2 interleaved addresses can be output at a constant rate through the use of the two output paths.

From the above description of the 3GPP interleaving scheme it can be seen that for each ten consecutive address values generated at most only two will be invalid (i.e. for every ten clock cycles there will be at least eight valid addresses). Further, two invalid addresses in two consecutive blocks of ten received addresses can only occur once for a given code segment.

As such, the compare module 410 includes a comparator 412 followed by the FIFO 411. The comparator 412 checks the validity of each output address by comparing the received address with the length of the received code segment, and only writes valid addresses to the FIFO 411. When the FIFO 411 is full, a "FIFO full" signal is created. This signal is used to halt the interleaver operation by stopping the clock signals being sent to the row counter 401 so the FIFO 411 will not overflow. Accordingly, the addresses can be read out of the FIFO 411 at a constant rate with the interleaving operation being stopped when necessary to avoid FIFO over flow. Typically, the clock rate applied to the row counter 401 will be faster than the clock rate used by the compare module 410 to compensate for the invalid address.

Two examples of alternatives for determining the size of the FIFO 411 and interleaver rate are:
(1) Output eight valid addresses for each 10 clock cycles. Choosing a FIFO of length of 3 ensures that the FIFO 411 will never run out of values.
(2) Output 9 valid addresses for each 10 clock cycles. In this option a FIFO size of 4 is required to ensure the FIFO 411 will not run out of valid addresses.

FIG. 5 illustrates the multiply and modulo module 407. As stated above the purpose of the multiply and modulo module 407 is to compute $(j*r_i) \bmod(p')$, where p' is set equal to p−1 when the AGU 309 is configured to operate in accordance with the 3GPP standard and equal to C when the AGU is configured to operate in accordance with the 3GPP2 standard.

The multiply and modulo module 407 is arranged to utilize the fact that the AGU 309 runs sequentially on all the rows starting from column 0, when operating according to the 3GPP standard, or column 1, when operating according to the 3GPP2 standard. This allows the for an efficient recursive computation based on the equation:

$$(j*r_i)\bmod(p')=(((j-1)*r_i)\bmod(p')+(r_i)\bmod(p'))\bmod(p')$$

The multiply and modulo module 407 includes a fifth LUT 501, a first adder 502, a second adder 503, a third adder 504, a multiplexer 505 and a register 506 for storing p'.

The fifth LUT 501 has an input coupled to the column counter 402 and a first output coupled to the first adder 502 and a second output coupled to the second adder 503.

The first adder 502 has a second input for receiving permutated modulo prime sequence numbers (i.e. $r_i$ mod p') from the third LUT 405 and an output that feeds back to the fifth LUT 501 and which also forms the second output for the multiply and modulo module 407, which is used when the AGU 309 is configured to operate in accordance with the 3GPP2 standard.

The second adder 503 has a second input for receiving permutated modulo prime sequence numbers from the third LUT 405 and an output that is directly coupled to one input of the multiplexer 505 and to a second input of the multiplexer 505 via the third adder 504, where the third adder 504 has an additional input for receiving p' information from the register 506.

The output from the multiplexer 505 provides (j*ri)mod (p') values where:

$$(j*r_i)\bmod(p')=(((j-1)*r_i)\bmod(p')+(r_i)\bmod(p'))\bmod(p')$$

The right hand side of the above equation defines the recursive aspect of the calculation where the first term $(((j-1)*r_i)\bmod(p'))$ is the value stored in the fifth LUT 501, having been input from the output of the first adder 502 in the previous recursive iteration. The second term $(r_i)\bmod(p')$ is read from the third LUT 405, where as stated above the third LUT 405 stores $(r_j)\bmod p'$ in order to enable this recursive implementation.

The first adder 502 and second adder 503 implement the addition of the two terms from the third LUT 405 and fifth LUT 501.

For the 3GPP2 implementation as C is always a power of two the modulo operation is implemented by taking the appropriate number of LSB bits from the first adder 502, for the first output, and the second adder 503, for the second output.

For the 3GPP implementation, the modulo is calculated as follows:

Because the inputs to the second adder 503 are mod p' values (i.e. the inputs are smaller than p') the output from the second adder 503 should always be smaller than 2p'. Therefore there are two options:

- first, the second adder 503 result is smaller that p'. In this case, this is the final result and is output to the fourth LUT 406, via the multiplexer;
- second, the second adder 503 result is bigger than p' (or equivalently, such as the second adder result minus p' is a non negative number). In this case the result is the second adder output minus p'. This subtraction is performed by the third adder 504 using the stored p' value in the register 506.

The multiplexer 505 chooses one of these two options according to whether the second adder result 503 minus p' is negative or not. The selected result is output to the fourth LUT 406.

It will be apparent to those skilled in the art that the disclosed subject matter may be modified in numerous ways and may assume many embodiments other than the preferred forms specifically set out as described above, for example the above embodiments could be arranged such that AGU could be configured to support interleaving for other wireless communication standards

The invention claimed is:

1. An interleaver for a turbo encoder and decoder comprising:
    a first table populated with a first set of parameters to allow intra-row permutation of data within an array in accordance with a first wireless communication standard when operation in the first wireless communication standard is required; and
    a second table populated with a second set of parameters to allow inter-row permutation of the data in accordance with the first wireless communication standard when operation in the first wireless communication standard is required wherein the first table is populated with a third set of parameters to allow intra-row permutation of data within an array in accordance with a second wireless communication standard when operation in the second wireless communication standard is required and to populate the second table with a fourth set of parameters to allow inter-row permutation of the data in accordance with the second wireless communication standard when operation in the second wireless communication standard is required;
    wherein the interleaver further comprises a buffer arranged to compare received interleaved addresses with the size of the data array and to store valid addresses;
    wherein the buffer is arranged to control the flow of data into the interleaver, such that when a predetermined number of addresses have been stored in the buffer the buffer stops the flow of data into the interleaver to allow the outputting of addresses from the buffer to be performed at substantially a constant rate.

2. An interleaver according to claim 1, wherein the first wireless communication standard is the family of WCDMA standards within 3GPP.

3. An interleaver according to claim 2, wherein the second wireless communication standard is the family of WODMA standards within 3GPP2.

4. An interleaver according to claim 3, wherein the parameters populated in the first table are $(Rj)\bmod(p')$, where j is the row number for the data array, Rj is a row specific prime number for the array and p corresponds to a selected prime number minus 1 for the 3GPP standard and the total number of columns within the data array for 3GPP2.

5. An interleaver according to claim 4, further comprising a multiply and modulo module arranged to receive $(Rj)\bmod(p')$ values from the first table and to generate and output via a first output $[i \times Rj] \bmod(p')$ where i corresponds to the columns of the array.

6. An interleaver according to claim 5, wherein the multiply and modulo module is arranged to generate and output via a second output $[i \times Rj] \bmod(p')$ when operating in the family of WCDMA standards within 3GPP2.

7. An interleaver according to claim 1, wherein the parameters populated in the second table are inter-row permutation sequences multiplied by column numbers associated with the array.

8. An interleaver according to claim 1, wherein a rate of received interleaved addresses to the buffer is responsive to a relationship between valid and invalid addresses.

9. An interleaver according to claim 1, wherein a size of the buffer is responsive to a relationship between valid and invalid addresses.

10. A turbo encoder comprising an interleaver according to claim 9, and a processor arranged to populate the first table and second table with the first set of parameters and the second set of parameters respectively when operation in the first wireless communication standard is required and to populate the first table and the second table with the third set of parameters and the fourth set of parameters respectively when operation in the second communication standard is required.

11. An interleaver according to claim 1, wherein the buffer is adapted to avoid introducing irregularity into the timing of the output of the interleaved address.

12. A method for interleaving m a turbo encoder and decoder comprising:
    populating a first table with a first set of parameters to allow intra-row permutation of data within an array in accordance with a first wireless communication standard when operation in the first wireless communication standard is required;
    populating a second table with a second set of parameters to allow inter-row permutation of the data in accordance with the first wireless communication standard when operation in the first wireless communication standard is required;
    populating the first table with a third set of parameters to allow intra-row permutation of data within an array in accordance with a second wireless communication standard when operation in the second wireless communication standard is required;
    populating the second table with a fourth set of parameters to allow inter-row permutation of the data in accordance with the second wireless communication standard when operation in the second wireless communication standard is required;

comparing received interleaved addresses with the size of the data array;

storing in a buffer valid addresses; and controlling the flow of data into an interleaver, such that when a predetermined number of addresses have been stored in the buffer the buffer stops the flow of data into the interleaver to allow the outputting of addresses from the buffer to be performed at substantially a constant rate.

13. The method according to claim 12, wherein a rate of received interleaved addresses to the buffer is responsive to a relationship between valid and invalid addresses.

14. The method according to claim 12, wherein a size of the buffer is responsive to a relationship between valid and invalid addresses.

* * * * *

UNITED STATES PATENT AND TRADEMARK OFFICE
CERTIFICATE OF CORRECTION

| | | |
|---|---|---|
| PATENT NO. | : 7,734,989 B2 | Page 1 of 1 |
| APPLICATION NO. | : 10/596369 | |
| DATED | : June 8, 2010 | |
| INVENTOR(S) | : Gideon Kutz et al. | |

It is certified that error appears in the above-identified patent and that said Letters Patent is hereby corrected as shown below:

Column 12, Line 47, please change "m" to --in--

Signed and Sealed this
Eighteenth Day of October, 2011

David J. Kappos
*Director of the United States Patent and Trademark Office*